United States Patent
Guo et al.

(10) Patent No.: US 11,538,529 B2
(45) Date of Patent: Dec. 27, 2022

(54) ADJUSTING VOLTAGE LEVELS APPLIED TO A CONTROL GATE OF A STRING DRIVER IN A MEMORY

(71) Applicant: MICRON TECHNOLOGY, INC., Boise, ID (US)

(72) Inventors: Xiaojiang Guo, San Jose, CA (US); Guanglei An, San Jose, CA (US); Qiang Tang, Cupertino, CA (US)

(73) Assignee: Micron Technology, Inc., Boise, ID (US)

( * ) Notice: Subject to any disclaimer, the term of this patent is extended or adjusted under 35 U.S.C. 154(b) by 12 days.

(21) Appl. No.: 17/176,345

(22) Filed: Feb. 16, 2021

(65) Prior Publication Data

US 2021/0166767 A1 Jun. 3, 2021

Related U.S. Application Data

(62) Division of application No. 16/412,627, filed on May 15, 2019, now Pat. No. 10,937,505, which is a division of application No. 15/693,133, filed on Aug. 31, 2017, now Pat. No. 10,388,382.

(51) Int. Cl.

| G11C 16/12 | (2006.01) |
| G11C 16/14 | (2006.01) |
| G11C 16/04 | (2006.01) |
| G11C 16/08 | (2006.01) |
| G11C 16/10 | (2006.01) |
| G11C 16/34 | (2006.01) |
| G11C 8/08 | (2006.01) |

(52) U.S. Cl.
CPC .......... *G11C 16/12* (2013.01); *G11C 16/0483* (2013.01); *G11C 16/08* (2013.01); *G11C 16/10* (2013.01); *G11C 16/14* (2013.01); *G11C 16/3459* (2013.01); *G11C 8/08* (2013.01)

(58) Field of Classification Search
None
See application file for complete search history.

(56) References Cited

U.S. PATENT DOCUMENTS

| 2003/0043686 A1 | 3/2003 | Lee et al. |
| 2003/0133326 A1 | 7/2003 | Hosono et al. |
| 2005/0093613 A1 | 5/2005 | Nazarian et al. |
| 2007/0109862 A1* | 5/2007 | Kim .................... G11C 8/10 365/185.23 |

(Continued)

*Primary Examiner* — J. H. Hur
(74) *Attorney, Agent, or Firm* — Dicke, Billig & Czaja, PLLC

(57) ABSTRACT

Methods of operating a memory, and memories having a controller configured to cause the memory to perform such methods, include applying a plurality of first voltage levels to an access line, applying a plurality of second voltage levels to a control gate of a string driver connected to the access line for a first portion of the plurality of first voltage levels with each second voltage level of the plurality of second voltage levels being greater than a respective first voltage level by a first voltage differential, and applying a plurality of third voltage levels to the control gate of the string driver for a second portion of the plurality of first voltage levels with each third voltage level of the plurality of third voltage levels being greater than a respective first voltage level by a second voltage differential less than the first voltage differential.

20 Claims, 11 Drawing Sheets

(56) References Cited

U.S. PATENT DOCUMENTS

| | | | |
|---|---|---|---|
| 2011/0051520 A1* | 3/2011 | Kim | G11C 16/0483 |
| | | | 365/185.11 |
| 2011/0194353 A1 | 8/2011 | Hwang et al. | |
| 2012/0155168 A1* | 6/2012 | Kim | G11C 5/14 |
| | | | 365/185.23 |
| 2013/0182506 A1 | 7/2013 | Melik-Martirosian | |
| 2014/0169064 A1 | 6/2014 | Choi | |

* cited by examiner

ADJUSTING VOLTAGE LEVELS APPLIED TO A CONTROL GATE OF A STRING DRIVER IN A MEMORY

RELATED APPLICATIONS

This Application is a Divisional of U.S. application Ser. No. 16/412,627, titled "METHODS AND APPARATUS FOR PROGRAMMING MEMORY," filed May 15, 2019, now U.S. Pat. No. 11,024,388 issued on Jun. 1, 2021, which is a Divisional of U.S. application Ser. No. 15/693,133, titled "METHODS AND APPARATUS FOR PROGRAMMING MEMORY," filed Aug. 31, 2017, now U.S. Pat. No. 10,388,382, issued on Aug. 20, 2019, which are commonly assigned and incorporated herein by reference. This Application is further related to U.S. application Ser. No. 16/412,661, titled "METHODS FOR PROGRAMMING MEMORY," filed May 15, 2019, which is a Continuation of U.S. application Ser. No. 15/693,133.

TECHNICAL FIELD

The present disclosure relates generally to memory and, in particular, in one or more embodiments, the present disclosure relates to memory architecture and its operation for programming the memory.

BACKGROUND

Memory devices are typically provided as internal, semiconductor, integrated circuit devices in computers or other electronic devices. There are many different types of memory including random-access memory (RAM), read only memory (ROM), dynamic random access memory (DRAM), synchronous dynamic random access memory (SDRAM), and flash memory.

Flash memory has developed into a popular source of non-volatile memory for a wide range of electronic applications. Flash memory typically use a one-transistor memory cell that allows for high memory densities, high reliability, and low power consumption. Changes in threshold voltage (Vt) of the memory cells, through programming (which is often referred to as writing) of charge storage structures (e.g., floating gates or charge traps) or other physical phenomena (e.g., phase change or polarization), determine the data state (e.g., data value) of each memory cell. Common uses for flash memory and other non-volatile memory include personal computers, personal digital assistants (PDAs), digital cameras, digital media players, digital recorders, games, appliances, vehicles, wireless devices, mobile telephones, and removable memory modules, and the uses for non-volatile memory continue to expand.

A NAND flash memory is a common type of flash memory device, so called for the logical form in which the basic memory cell configuration is arranged. Typically, the array of memory cells for NAND flash memory is arranged such that the control gate of each memory cell of a row of the array is connected together to form an access line, such as a word line. Columns of the array include strings (often termed NAND strings) of memory cells connected together in series between a pair of select gates, e.g., a source select transistor and a drain select transistor. Each source select transistor may be connected to a source, while each drain select transistor may be connected to a data line, such as column bit line. Variations using more than one select gate between a string of memory cells and the source, and/or between the string of memory cells and the data line, are known.

Programming memory typically utilizes an iterative process of applying a programming pulse to a memory cell and verifying if that memory cell has reached its desired data state in response to that programming pulse, and repeating that iterative process until that memory cell passes the verification. Once a memory cell passes the verification, it may be inhibited from further programming. The iterative process can be repeated with changing (e.g., increasing) voltage levels of the programming pulse until each memory cell selected for the programming operation has reached its respective desired data state, or some failure is declared, e.g., reaching a maximum number of allowed programming pulses during the programming operation.

A general trend in semiconductor memory fabrication is to increase memory density. This might be accomplished by decreasing feature sizes and/or utilizing three-dimensional array structures to increase the number of memory cells formed in a given area of a semiconductor wafer. However, such techniques can increase the RC (resistive-capacitive) time constant of conductive structures (e.g., access lines) used to access the memory cells, due to increased resistance levels of the structures themselves, and due to increased capacitive coupling of neighboring structures. This, in turn, can increase the time necessary to bring such an access line up to a desired voltage level for an access operation, such as a programming operation.

DETAILED DESCRIPTION

Figure 1:
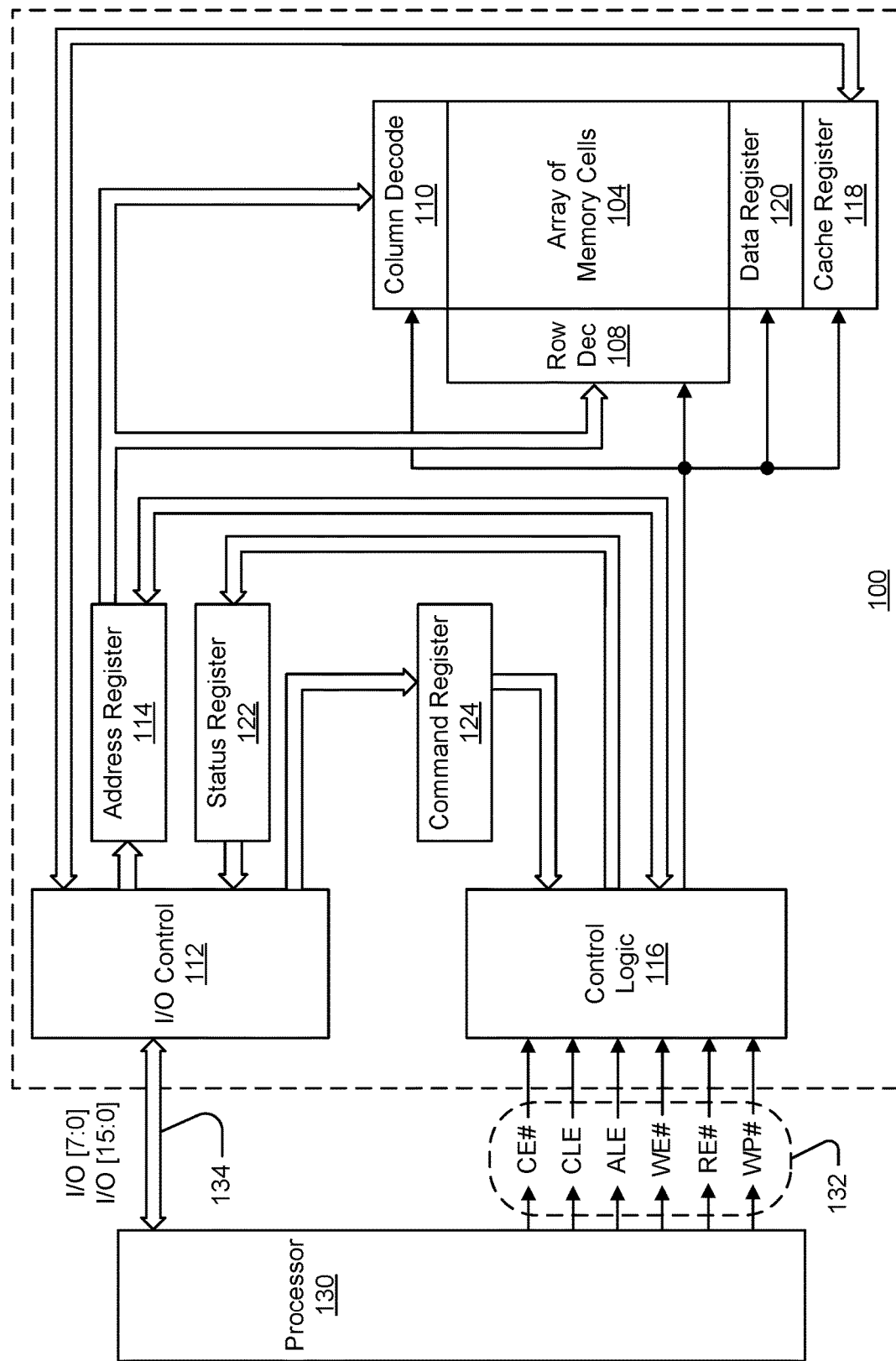
FIG. 1 is a simplified block diagram of a memory in communication with a processor as part of an electronic system, according to an embodiment.

In the following detailed description, reference is made to the accompanying drawings that form a part hereof, and in which is shown, by way of illustration, specific embodiments. In the drawings, like reference numerals describe substantially similar components throughout the several views. Other embodiments may be utilized and structural, logical and electrical changes may be made without departing from the scope of the present disclosure. The following detailed description is, therefore, not to be taken in a limiting sense.

The term "semiconductor" used herein can refer to, for example, a layer of material, a wafer, or a substrate, and includes any base semiconductor structure. "Semiconductor" is to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a semiconductor in the following description, previous process steps may have been utilized to form regions/junctions in the base semiconductor structure, and the term semiconductor can include the underlying layers containing such regions/junctions. The term conductive as used herein, as well as its various related forms, e.g., conduct, conductively, conducting, conduction, conductivity, etc., refers to electrically conductive unless otherwise apparent from the context. Similarly, the term connecting as used herein, as well as its various related forms, e.g., connect, connected, connection, etc., refers to electrically connecting unless otherwise apparent from the context. Although particular values of voltages may be given in the description to aid understanding, such voltages may be dependent upon the specific design, materials and technology used in fabrication in manners understood by those in the field of integrated circuit fabrication, design and operation. Furthermore, while particular types of field-effect transistors may be given in the description to aid understanding, other types of field-effect transistors may be substituted in manners understood by those in the field of integrated circuit fabrication, design and operation.

FIG. 1 is a simplified block diagram of a first apparatus, in the form of a memory (e.g., memory device) 100, in communication with a second apparatus, in the form of a processor 130, as part of a third apparatus, in the form of an electronic system, according to an embodiment. Some examples of electronic systems include personal computers, personal digital assistants (PDAs), digital cameras, digital media players, digital recorders, games, appliances, vehicles, wireless devices, cellular telephones and the like. The processor 130, e.g., a controller external to the memory device 100, may be a memory controller or other external host device.

Memory device 100 includes an array of memory cells 104 logically arranged in rows and columns. Memory cells of a logical row are typically connected to the same access line (commonly referred to as a word line) while memory cells of a logical column are typically selectively connected to the same data line (commonly referred to as a bit line). A single access line may be associated with more than one logical row of memory cells and a single data line may be associated with more than one logical column. Memory cells (not shown in FIG. 1) of at least a portion of array of memory cells 104 are capable of being programmed to one of at least two data states.

A row decode circuitry 108 and a column decode circuitry 110 are provided to decode address signals. Address signals are received and decoded to access the array of memory cells 104. Memory device 100 also includes input/output (I/O) control circuitry 112 to manage input of commands, addresses and data to the memory device 100 as well as output of data and status information from the memory device 100. An address register 114 is in communication with I/O control circuitry 112 and row decode circuitry 108 and column decode circuitry 110 to latch the address signals prior to decoding. A command register 124 is in communication with I/O control circuitry 112 and control logic 116 to latch incoming commands.

A controller (e.g., the control logic 116 internal to the memory device 100) controls access to the array of memory cells 104 in response to the commands and generates status information for the external processor 130, i.e., control logic 116 is configured to perform access operations (e.g., read operations, program operations and/or erase operations) in accordance with embodiments described herein. The control logic 116 is in communication with row decode circuitry 108 and column decode circuitry 110 to control the row decode circuitry 108 and column decode circuitry 110 in response to the addresses.

Control logic 116 is also in communication with a cache register 118. Cache register 118 latches data, either incoming or outgoing, as directed by control logic 116 to temporarily store data while the array of memory cells 104 is busy writing or reading, respectively, other data. During a program operation (e.g., write operation), data is passed from the cache register 118 to data register 120 for transfer to the array of memory cells 104; then new data is latched in the cache register 118 from the I/O control circuitry 112. During a read operation, data is passed from the cache register 118 to the I/O control circuitry 112 for output to the external processor 130; then new data is passed from the data register 120 to the cache register 118. A status register 122 is in communication with I/O control circuitry 112 and control logic 116 to latch the status information for output to the processor 130.

Memory device 100 receives control signals at control logic 116 from processor 130 over a control link 132. The control signals might include a chip enable CE #, a command latch enable CLE, an address latch enable ALE, a write enable WE #, a read enable RE #, and a write protect WP #. Additional or alternative control signals (not shown) may be further received over control link 132 depending upon the nature of the memory device 100. Memory device 100 receives command signals (which represent commands), address signals (which represent addresses), and data signals (which represent data) from processor 130 over a multiplexed input/output (I/O) bus 134 and outputs data to processor 130 over I/O bus 134.

For example, the commands are received over input/output (I/O) pins [7:0] of I/O bus 134 at I/O control circuitry 112 and are written into command register 124. The addresses are received over input/output (I/O) pins [7:0] of I/O bus 134 at I/O control circuitry 112 and are written into address register 114. The data are received over input/output (I/O) pins [7:0] for an 8-bit device or input/output (I/O) pins [15:0] for a 16-bit device at I/O control circuitry 112 and are written into cache register 118. The data are subsequently written into data register 120 for programming the array of memory cells 104. For another embodiment, cache register 118 may be omitted, and the data are written directly into data register 120. Data are also output over input/output (I/O) pins [7:0] for an 8-bit device or input/output (I/O) pins [15:0] for a 16-bit device.

It will be appreciated by those skilled in the art that additional circuitry and signals can be provided, and that the memory device 100 of FIG. 1 has been simplified. It should be recognized that the functionality of the various block components described with reference to FIG. 1 may not necessarily be segregated to distinct components or component portions of an integrated circuit device. For example, a single component or component portion of an integrated circuit device could be adapted to perform the functionality of more than one block component of FIG. 1. Alternatively, one or more components or component portions of an integrated circuit device could be combined to perform the functionality of a single block component of FIG. 1.

Additionally, while specific I/O pins are described in accordance with popular conventions for receipt and output of the various signals, it is noted that other combinations or numbers of I/O pins may be used in the various embodiments.

Figure 2A:
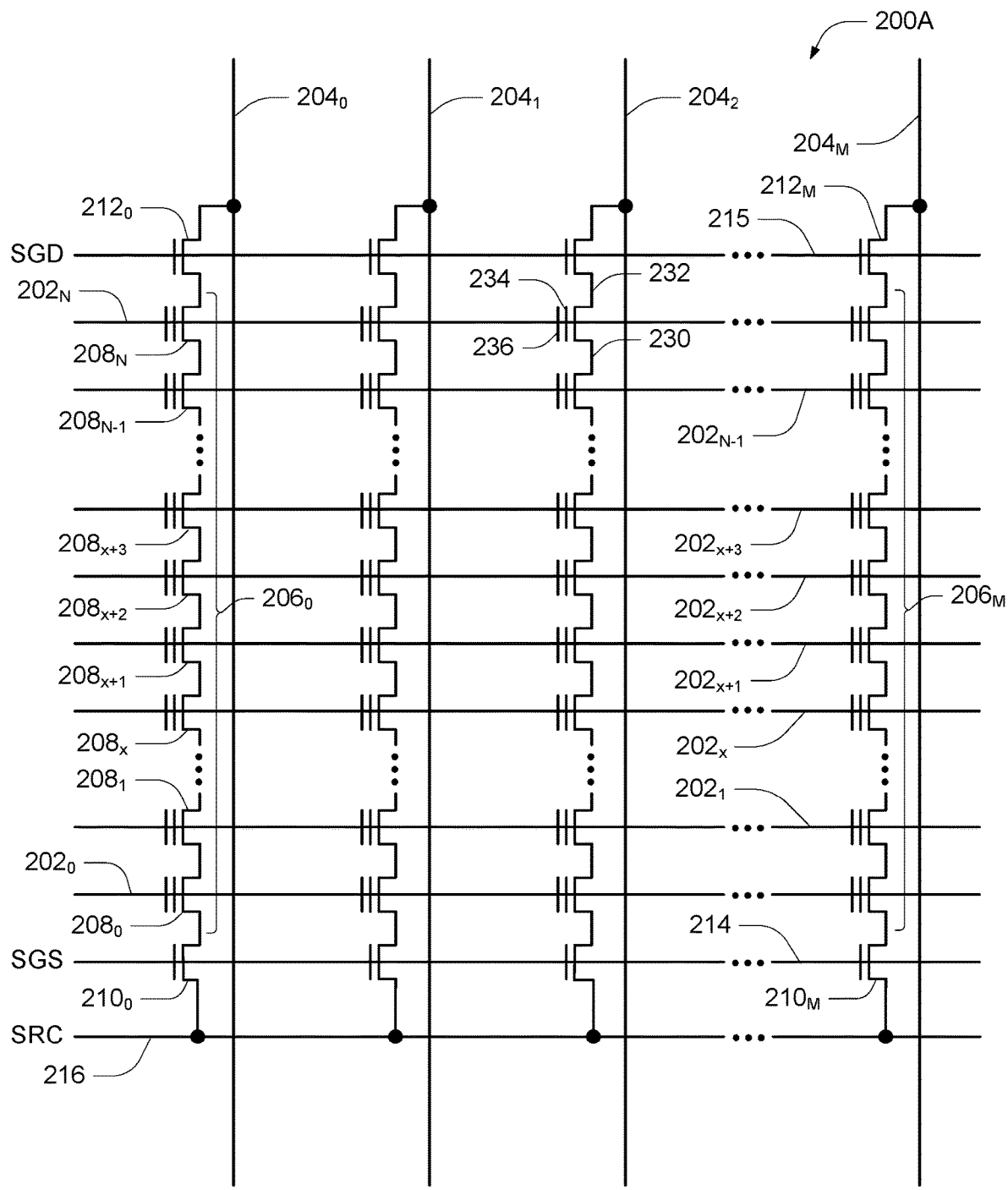
FIGS. 2A-2B are schematics of portions of an array of memory cells as could be used in a memory of the type described with reference to FIG. 1.

FIG. 2A is a schematic of a portion of an array of memory cells 200A as could be used in a memory of the type described with reference to FIG. 1, e.g., as a portion of array of memory cells 104. Memory array 200A includes access lines, such as word lines $202_0$ to $202_N$, and a data line, such as bit line 204. The word lines 202 may be connected to global access lines (e.g., global word lines), not shown in FIG. 2A, in a many-to-one relationship. For some embodiments, memory array 200A may be formed over a semiconductor that, for example, may be conductively doped to have a conductivity type, such as a p-type conductivity, e.g., to form a p-well, or an n-type conductivity, e.g., to form an n-well.

Memory array 200A might be arranged in rows (each corresponding to a word line 202) and columns (each corresponding to a bit line 204). Each column may include a string of series-connected memory cells (e.g., non-volatile memory cells), such as one of NAND strings 2060 to 206M. Each NAND string 206 might be connected (e.g., selectively connected) to a common source 216 and might include memory cells $208_0$ to $208_N$. The memory cells 208 may represent non-volatile memory cells for storage of data. The memory cells 208 of each NAND string 206 might be connected in series between a select gate 210 (e.g., a field-effect transistor), such as one of the select gates $210_0$ to $210_M$ (e.g., that may be source select transistors, commonly referred to as select gate source), and a select gate 212 (e.g., a field-effect transistor), such as one of the select gates $212_0$ to $212_M$ (e.g., that may be drain select transistors, commonly referred to as select gate drain). Select gates $210_0$ to $210_M$ might be commonly connected to a select line 214, such as a source select line, and select gates $212_0$ to $212_M$ might be commonly connected to a select line 215, such as a drain select line. Although depicted as traditional field-effect transistors, the select gates 210 and 212 may utilize a structure similar to (e.g., the same as) the memory cells 208. The select gates 210 and 212 might represent a plurality of select gates connected in series, with each select gate in series configured to receive a same or independent control signal.

A source of each select gate 210 might be connected to common source 216. The drain of each select gate 210 might be connected to a memory cell $208_0$ of the corresponding NAND string 206. For example, the drain of select gate $210_0$ might be connected to memory cell $208_0$ of the corresponding NAND string 2060. Therefore, each select gate 210 might be configured to selectively connect a corresponding NAND string 206 to common source 216. A control gate of each select gate 210 might be connected to select line 214.

The drain of each select gate 212 might be connected to the bit line 204 for the corresponding NAND string 206. For example, the drain of select gate $212_0$ might be connected to the bit line 2040 for the corresponding NAND string 2060. The source of each select gate 212 might be connected to a memory cell $208_N$ of the corresponding NAND string 206. For example, the source of select gate $212_0$ might be connected to memory cell $208_N$ of the corresponding NAND string 2060. Therefore, each select gate 212 might be configured to selectively connect a corresponding NAND string 206 to the common bit line 204. A control gate of each select gate 212 might be connected to select line 215.

The memory array in FIG. 2A might be a three-dimensional memory array, e.g., where NAND strings 206 may extend substantially perpendicular to a plane containing the common source 216 and to a plane containing a plurality of bit lines 204 that may be substantially parallel to the plane containing the common source 216.

Typical construction of memory cells 208 includes a data-storage structure 234 (e.g., a floating gate, charge trap, etc.) that can determine a data state of the memory cell (e.g., through changes in threshold voltage), and a control gate 236, as shown in FIG. 2A. The data-storage structure 234 may include both conductive and dielectric structures while the control gate 236 is generally formed of one or more conductive materials. In some cases, memory cells 208 may further have a defined source/drain (e.g., source) 230 and a defined source/drain (e.g., drain) 232. Memory cells 208 have their control gates 236 connected to (and in some cases form) a word line 202.

A column of the memory cells 208 may be a NAND string 206 or a plurality of NAND strings 206 selectively connected to a given bit line 204. A row of the memory cells 208 may be memory cells 208 commonly connected to a given word line 202. A row of memory cells 208 can, but need not, include all memory cells 208 commonly connected to a given word line 202. Rows of memory cells 208 may often be divided into one or more groups of physical pages of memory cells 208, and physical pages of memory cells 208 often include every other memory cell 208 commonly connected to a given word line 202. For example, memory cells 208 commonly connected to word line $202_N$ and selectively connected to even bit lines 204 (e.g., bit lines 2040, 2042, 2044, etc.) may be one physical page of memory cells 208 (e.g., even memory cells) while memory cells 208 commonly connected to word line $202_N$ and selectively connected to odd bit lines 204 (e.g., bit lines 2041, 2043, 2045, etc.) may be another physical page of memory cells 208 (e.g., odd memory cells). Although bit lines 2043-2045 are not explicitly depicted in FIG. 2A, it is apparent from the figure that the bit lines 204 of the array of memory cells 200A may be numbered consecutively from bit line 2040 to bit line 204M. Other groupings of memory cells 208 commonly connected to a given word line 202 may also define a physical page of memory cells 208. For certain memory devices, all memory cells commonly connected to a given word line might be deemed a physical page of memory cells. The portion of a physical page of memory cells (which, in some embodiments, could still be the entire row) that is read during a single read operation or programmed during a single programming operation (e.g., an upper or lower page of memory cells) might be deemed a logical page of memory cells. A block of memory cells may include those memory cells that are configured to be erased together, such as all memory cells connected to word lines $202_0$-$202_N$ (e.g., all NAND strings 206 sharing common word lines 202). Unless expressly distinguished, a reference to a page of memory cells herein refers to the memory cells of a logical page of memory cells.

Figure 2B:
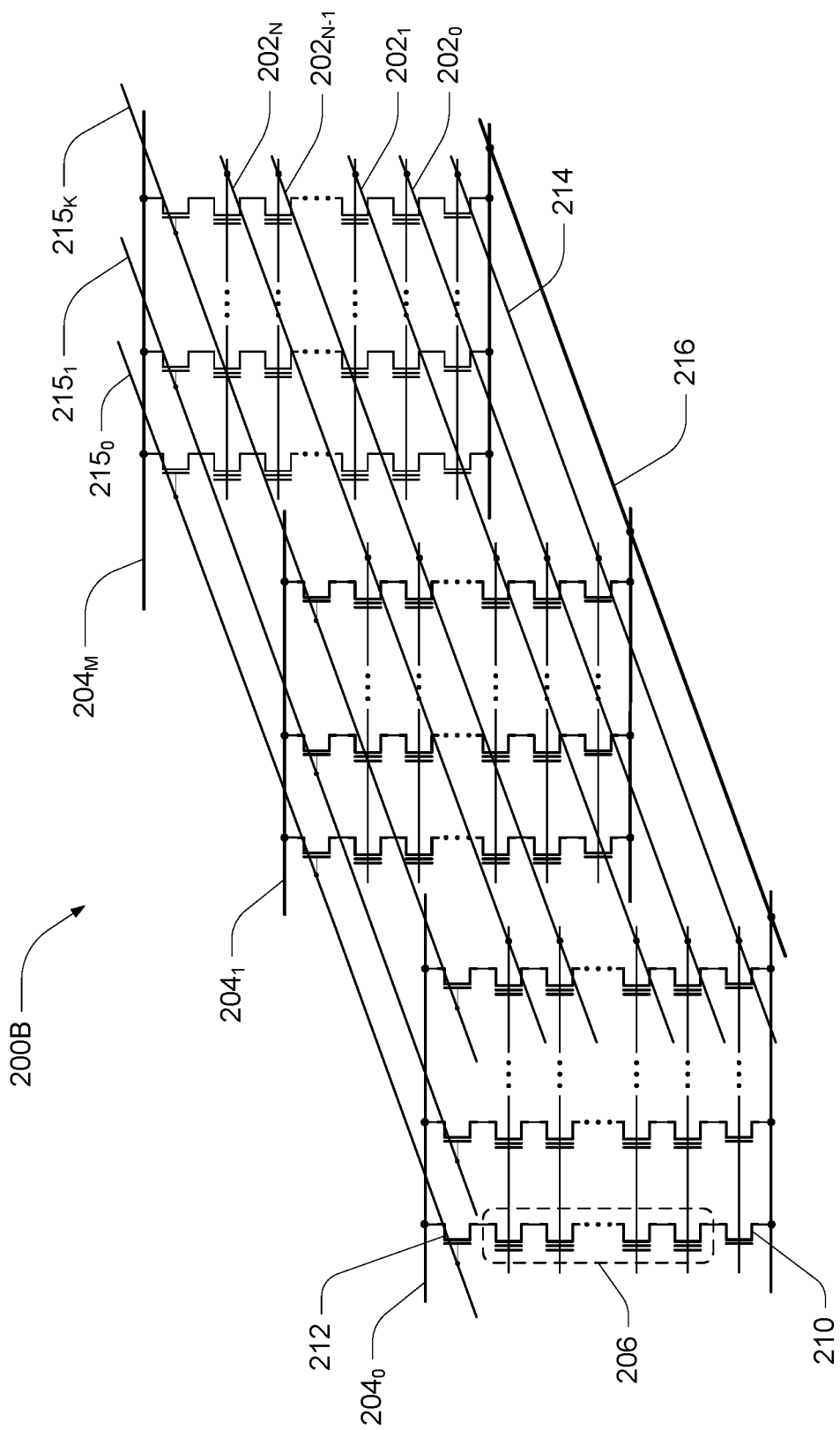

FIG. 2B is another schematic of a portion of an array of memory cells 200B as could be used in a memory of the type described with reference to FIG. 1, e.g., as a portion of array of memory cells 104. Like numbered elements in FIG. 2B correspond to the description as provided with respect to FIG. 2A. FIG. 2B provides additional detail of one example of a three-dimensional NAND memory array structure. The three-dimensional NAND memory array 200B may incorporate vertical structures which may include semiconductor pillars where a portion of a pillar may act as a channel region of the memory cells of NAND strings 206. The NAND strings 206 may be each selectively connected to a bit line 204 0-204M by a select transistor 212 (e.g., that may be drain select transistors, commonly referred to as select gate drain) and to a common source 216 by a select transistor 210 (e.g., that may be source select transistors, commonly referred to as select gate source). Multiple NAND strings 206 might be selectively connected to the same bit line 204. Subsets of NAND strings 206 can be connected to their respective bit lines 204 by biasing the select lines $215_0$-$215_K$ to selectively activate particular select transistors 212 each between a NAND string 206 and a bit line 204. The select transistors 210 can be activated by biasing the select line 214. Each word line 202 may be connected to multiple rows of memory cells of the memory array 200B. Rows of memory cells that are commonly connected to each other by a particular word line 202 may collectively be referred to as tiers.

Figure 3A:
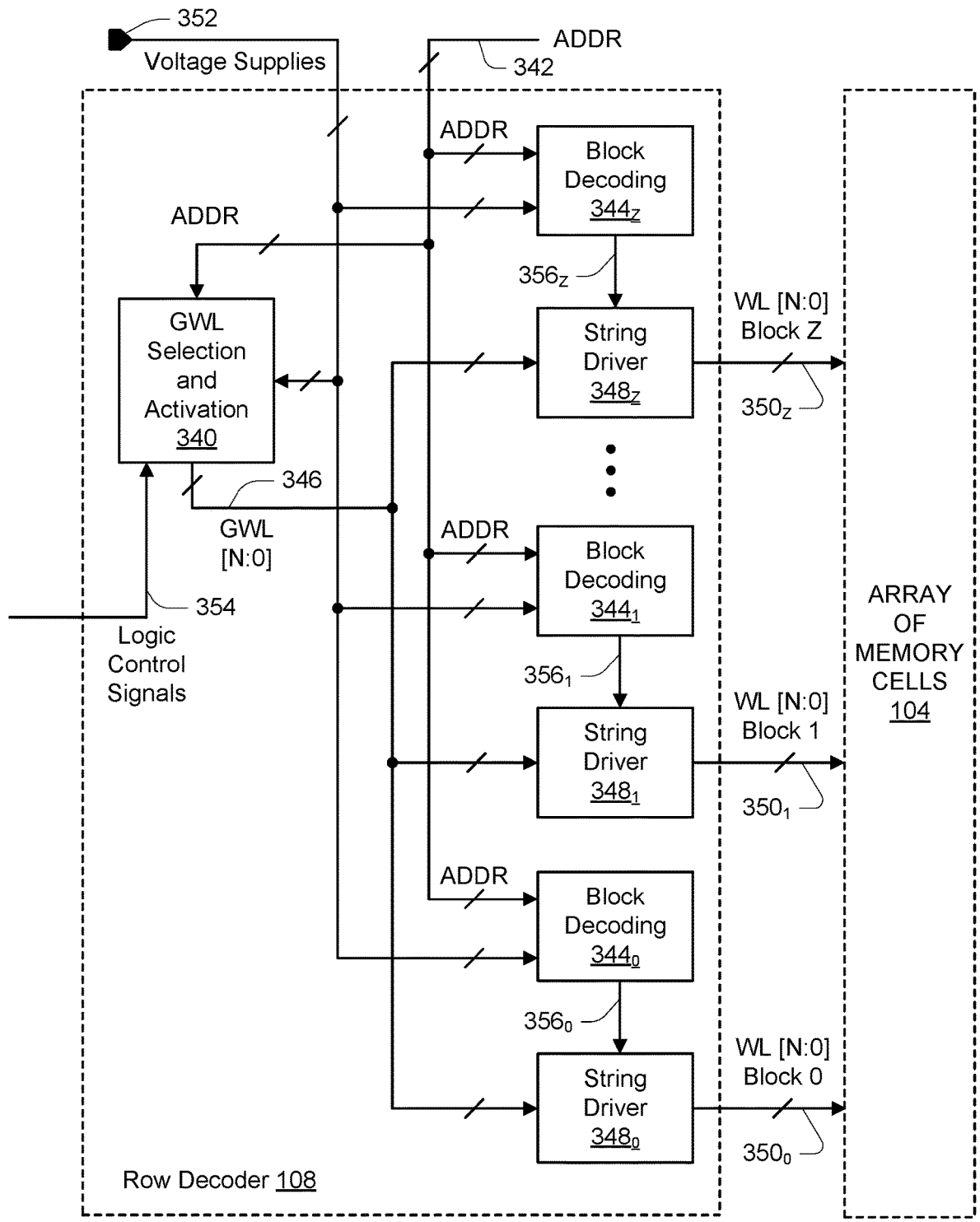
FIG. 3A is a block schematic of a row decoder 108 coupled to an array of memory cells 104 as could be used in a memory of the type described with reference to FIG. 1.

FIG. 3A is a block schematic of a row decoder 108 coupled to an array of memory cells 104 as could be used in a memory of the type described with reference to FIG. 1. The row decoder 108 is coupled to receive address signals 342, such as from the address register 114 of FIG. 1, at global word line (GWL) selection and activation circuitry 340 and at the block decoding circuitry 344, e.g., block decoding circuitry $344_0$-$344_Z$. The address signals 342 received by the GWL selection and activation circuitry 340 may include all address signals from the address register 114. However, GWL selection and activation circuitry 340 may only receive a portion of the address signals from the address register 114, such as those signals indicative of a target word line. Similarly, address signals 342 received by the block decoding circuitry 344 may include all address signals from the address register 114, or the block decoding circuitry 344 may only receive a portion of the address signals from the address register 114, such as those signals indicative of a target block of memory cells.

The GWL selection and activation circuitry 340 may be connected to receive one or more voltage signals from a set of voltage supplies 352. The block decoding circuitry 344 may also be connected to receive one or more voltage signals from the set of voltage supplies 352. The GWL selection and activation circuitry 340 may further be connected to receive a set of logic control signals 354, such as from the control logic 116 of FIG. 1. In response to the logic control signals 354, the GWL selection and activation circuitry 340 provides a set of GWL voltage signals 346 at its output for use in driving access lines (e.g., word lines) of one or more selected blocks of memory cells. The GWL voltage signals 346 are a composite of individual word line voltage signals, including one voltage signal for each of the N+1 word lines of a block of memory cells. For example, if a NAND string of a block of memory cells includes 32 memory cells (e.g., N=31), the GWL voltage signals 346 would include 32 voltages to drive the word lines associated with each of the memory cells of the NAND string.

The GWL voltage signals 346 are provided to one or more string drivers 348, which are typically high voltage switches designed to gate (e.g., pass) the full input voltage of the GWL voltage signals 346 as local word line (LWL) voltage signals 350 in response to an appropriate control gate voltage level. There would generally be a one-to-one correspondence between the string drivers 348 and the blocks of memory cells of the array of memory cells 104 to which the GWL selection and activation circuitry 340 is intended to supply. Thus, if the GWL selection and activation circuitry 348 is intended to service Z+1 blocks of memory cells of the array of memory cells 104, there would be Z+1 string drivers 348.

Each string driver 348 is selectively activated by a voltage signal 356 of an associated block decoding circuitry 344 in response to the address signals 342 received by the block decoding circuitry 344. Generally, only one of the Z+1 string drivers 348 would be activated at a time, thus connecting the GWL voltage signals 346 of the GWL selection and activation circuitry 340 to the word lines of one block of memory cells of the array of memory cells 104.

Figure 3B:
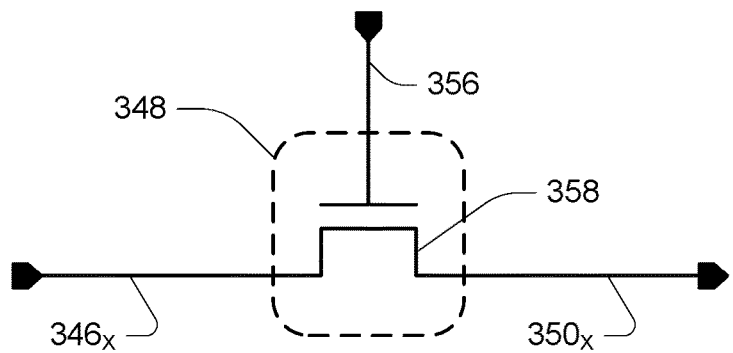
FIG. 3B is a schematic of a portion of a string driver as could be used in a memory of the type described with reference to FIG. 1.

FIG. 3B is a schematic of a portion of a string driver 348 as could be used in a memory of the type described with reference to FIG. 1. The string driver 348 of FIG. 3B might have a first input connected to receive a voltage signal from a GWL voltage signal 346 for a particular access line of a block of memory cells, e.g., GWL voltage signal $346_X$. The GWL voltage signal $346_X$ might come from the GWL selection and activation circuitry 340 of FIG. 3A. The string driver 348 of FIG. 3B might further have a second input connected to receive a voltage signal 356, such as from a block decoding circuitry 344 of FIG. 3A. The string driver 348 of FIG. 3B might include a field-effect transistor (FET) 358. The FET 358 might be a high-voltage n-type FET or nFET. The FET 358 has its control gate connected to receive the voltage signal 356 to selectively connect the GWL voltage signal $346_X$ to an access line of a block of memory cells, e.g., as a LWL voltage signal $350_X$.

To gate (e.g., pass) the full voltage level of a GWL voltage signal 346 to the corresponding LWL voltage signal 350, the voltage signal 356 to the control gate of the FET 358 should generally be at least the voltage level of the GWL voltage signal 346 plus the threshold voltage of the FET 358. Reductions in resistance through the FET 358 may be achieved by applying even higher voltage levels for the voltage signal 356. However, physical limitations of the FET 358 may limit how high the voltage signal 356 may effectively be set in relation to the GWL voltage signal 346, e.g., to mitigate damage to the FET 358. For example, a semiconductor device typically has a safe operating area (SOA) that combines various limitations on the device, such as voltage, current, power and junction temperature.

Typical values of the voltage signal 356 for prior art programming operations might be approximately the threshold voltage of the FET 358 plus 0.5V higher than the voltage level of the GWL voltage signal 346 for each programming pulse during a programming operation in order to mitigate damage to the FET 358 for voltage levels of the GWL voltage signals 346 experienced during the programming operation. Other fixed voltage additions might be used, e.g., a fixed value between 0V-1V, for example.

Figure 4A:
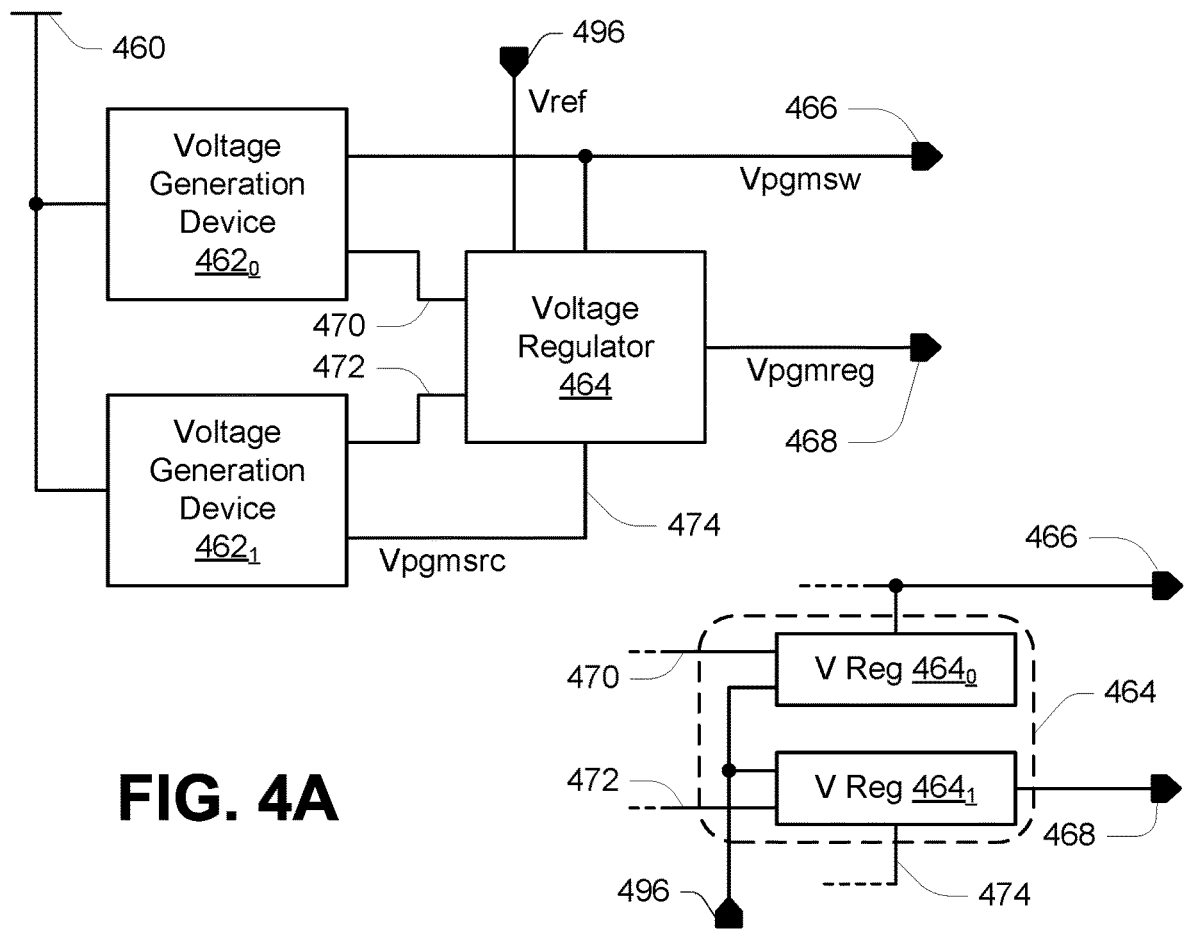
FIG. 4A is a block schematic of a portion of a voltage generation system in accordance with embodiments.

FIG. 4A is a block schematic of a portion of a voltage generation system in accordance with embodiments. The voltage generation system might include a first voltage generation device $462_0$ and a second voltage generation device $462_1$. The voltage generation devices $462_0$ and $462_1$ might represent charge pumps, for example. The voltage generation devices $462_0$ and $462_1$ might each be connected to a voltage node 460 configured to receive a supply voltage, e.g., Vcc. The voltage generation device $462_0$ might be configured to generate a voltage signal Vpgmsw at an output or voltage signal node 466. The voltage generation device $462_1$ might be configured to generate a voltage signal Vpgmsrc at an output or voltage signal node 474. A voltage regulator 464 may receive the input voltage signals Vpgmsw and Vpgmsrc, and generate a regulated voltage signal Vpgmreg at an output node 468. The voltage regulator 464 might further be connected to a voltage signal node 496 configured to receive a voltage signal Vref. The voltage regulator 464 may have a first output node 470 for providing a control signal to the voltage generation device $462_0$ for enabling or disabling the voltage generation device $462_0$, and may have a second output node 472 for providing a control signal to the voltage generation device $462_1$ for enabling or disabling the voltage generation device $462_1$. Enabling the voltage generation device $462_0$ or voltage generation device $462_1$ might increase a voltage level of its corresponding output voltage signal, while disabling the voltage generation device $462_0$ or voltage generation device $462_1$ might allow the voltage level of its corresponding output voltage signal to decrease.

The voltage signal Vpgmreg might represent a GWL voltage signal 346 of FIG. 3B, for example, which might be a voltage level of a programming pulse of a programming operation. The voltage signal Vpgmsrc might represent a voltage supply for generating the voltage signal Vpgmreg. The voltage signal Vref might represent a reference voltage signal representative of a target voltage level of the voltage signal Vpgmreg. The voltage signal Vpgmsw might represent a voltage signal 356 of FIG. 3B, for example. For some embodiments, the voltage signal Vpgmsw may also be used for generating the voltage signal Vpgmreg.

As further depicted in FIG. 4A, the voltage regulator 464 may represent a first voltage regulator $464_0$ and a second voltage regulator $464_1$. The first voltage regulator $464_0$ may be configured to generate the control signal for the output node 470 and the second voltage regulator $464_1$. May be configured to generate the control signal for the output node 472. Such a configuration might facilitate a larger degree of freedom in regulating a voltage level of the voltage signal Vpgmsw relative to the voltage level of the voltage signal Vpgmreg.

Figure 4B:
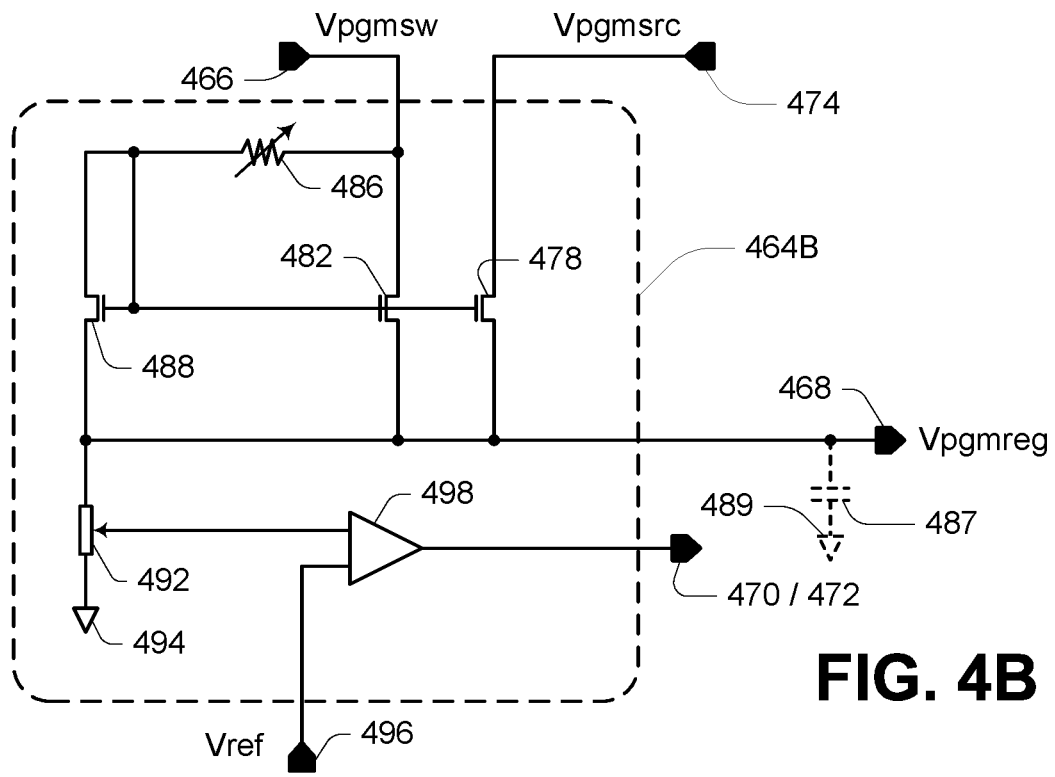
FIG. 4B is a schematic of a voltage regulator in accordance with an embodiment.

FIG. 4B is a schematic of a voltage regulator 464B in accordance with an embodiment. The voltage regulator 464B provides a single voltage regulator for regulating a voltage level of the voltage signal Vpgmsw and a voltage level of the voltage signal Vpgmreg. The voltage regulator 464B might include an nFET 478 having a first source/drain connected to the voltage signal node 474 and a second source/drain connected to the output node 468. The voltage regulator 464B might further include an nFET 482 having a first source/drain connected to the voltage signal node 466 and a second source/drain connected to the output node 468.

A variable resistance (e.g., resistor) 486 might have an input connected to the voltage signal node 466 and an output connected to a first source/drain of an nFET 488 and a control gate of the nFET 488, e.g., a diode-connected nFET 488. The variable resistance 486, in combination with the diode-connected nFET 488, may provide a variable resistance path between the voltage signal node 466 and the output node 468. The control gate of the diode-connected nFET 488 might further be connected to a control gate of the nFET 482 and a control gate of the nFET 478.

The output of the variable resistance 486 might represent a variable exit point of the variable resistance 486. The capacitor 487 and reference voltage node 489 might represent capacitive and/or parasitic capacitance of an access line, e.g., word line, to be connected to the output node 468, which may include connections through GWL selection and activation circuitry, a string driver and any other circuit path from the output node 468 to the access line.

The voltage regulator 464B may further include a voltage divider 492 connected between the output node 468 (and the second source/drain of the nFET 488) and a reference voltage node 494, e.g., connected to receive a reference voltage such as ground, 0V or Vss. A comparator 498 might have one input connected to an output of the voltage divider 492, and a second input connected to the voltage signal node 496. The output of the comparator 498 might provide the control signal (e.g., a same control signal) to the output nodes 470 and 472.

In the voltage regulator 464B, voltage divider 492 might provide adjustment of the gain of the voltage regulator 464B, effectively providing a control signal having a first logic level (e.g., a logic high level) when the voltage level received at the first input of the comparator 498 is less than the gain times the voltage level of the reference voltage signal Vref, and having a second logic level different than the first logic level (e.g., a logic low level) when the voltage level received at the first input of the comparator 498 is greater than the gain times the voltage level of the reference voltage signal Vref. Adjustment of the voltage divider 492 might include adjusting a ratio of a top resistance (e.g., resistance between the input and the output of the voltage divider 492) to a bottom resistance (e.g., resistance between the output of the voltage divider 492 and the reference voltage node 494). The voltage generation devices 462 of FIG. 4A might be configured to be enabled in response to a control signal having the first logic level, and disabled in response to a control signal having the second logic level. The variable resistance 486 might provide adjustment of the voltage differential between the voltage signal Vpgmsw and the voltage signal Vpgmreg. The variable resistance 486 might be sized to provide voltage differentials between the voltage signal Vpgmsw and the voltage signal Vpgmreg in a range of approximately 1V to 2.5V above a voltage drop of the diode-connected nFET 488. For example, for a diode constructed of a diode-connected field-effect transistor, the voltage drop of the diode might be approximately equal to the threshold voltage of the transistor. In the voltage regulator 464B, a resistance value on the order of a few 100K $\Omega$ might provide a voltage differential of approximately 1V above the voltage drop of the diode-connected nFET 488.

The variable resistance 486, in combination with the diode-connected nFET 488, may provide a variable resistance of a path (e.g., circuit path) between the voltage signal node 466 and the output node 468, where that variability is independent of a voltage level of the voltage signal node 466. That is, at any given voltage level of the voltage signal node 466, the resistance of the path may be varied. The variable resistance 486, in combination with the diode-connected nFET 488, may further provide a variable resistance of a path (e.g., circuit path) between the voltage signal node 466 and an input to the comparator 498, where that variability is independent of a gain of the voltage regulator 464B. That is, at any given gain of the voltage regulator 464B, the resistance of the path may be varied.

Figure 4C:
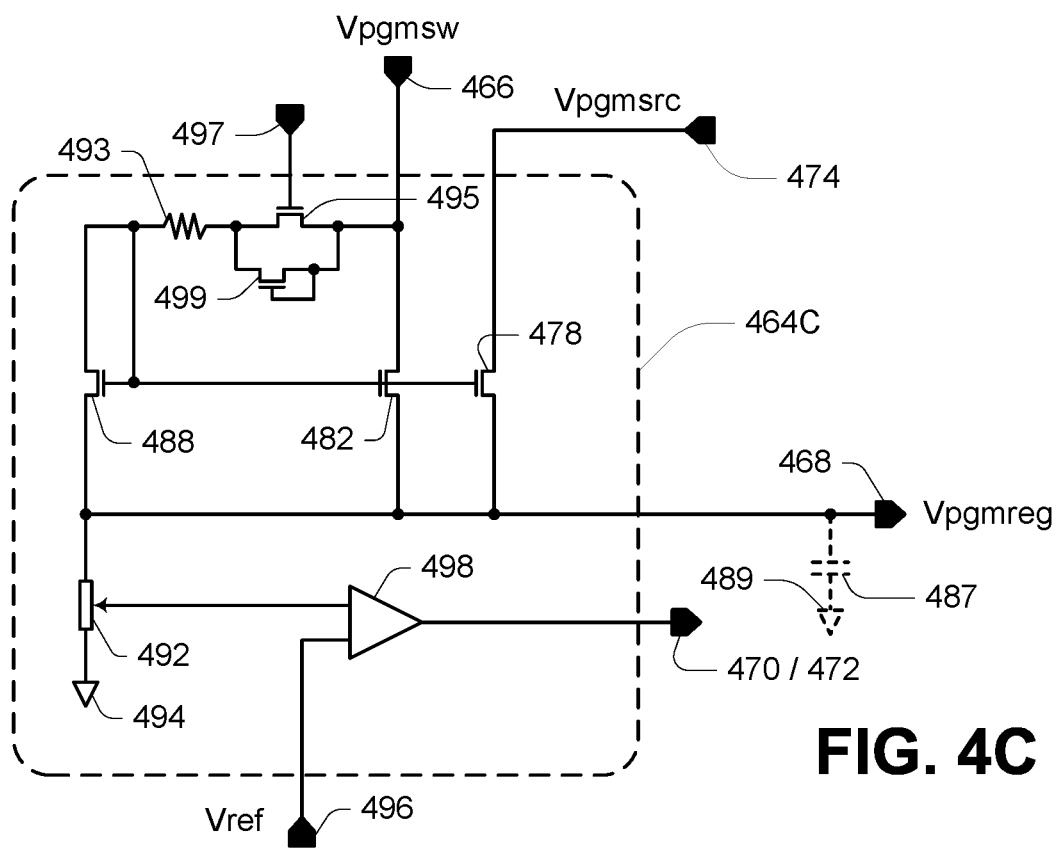
FIG. 4C is a schematic of a voltage regulator in accordance with another embodiment.

FIG. 4C is a schematic of a voltage regulator 464C in accordance with another embodiment. The voltage regulator 464C differs from the voltage regulator 464B by replacing the variable resistance 486 with a diode-connected nFET 499 and an nFET 495 connected in parallel between the voltage node 466 and an input of a resistance (e.g., resistor)

493 (e.g., fixed resistance) in series. While the voltage regulator 464B might facilitate adjustment of the voltage differential between the voltage signal Vpgmsw and the voltage signal Vpgmreg to have multiple different values, the voltage regulator 464C might facilitate adjustment of the voltage differential between the voltage signal Vpgmsw and the voltage signal Vpgmreg to have one of two discrete values for a given voltage level of the voltage signal node 466. For example, if the nFET 495 were deactivated in response to a control signal from the control signal node 497 received at its control gate, a first voltage differential between the voltage signal Vpgmsw and the voltage signal Vpgmreg might be obtained due to the series connection of the resistance 493 and the diode-connected nFET 499, while if the nFET 495 were activated, a second voltage differential between the voltage signal Vpgmsw and the voltage signal Vpgmreg, less than the first voltage differential, might be obtained due to the bypass of the diode-connected nFET 499. As one example, the resistance 493 might be configured (e.g., sized) to provide an approximately 1V voltage differential above a voltage drop of the diode-connected nFET 488, and the diode-connected nFET 499 might be configured to provide an approximately 1V-2V (e.g., 1.5V) additional voltage differential.

The variable resistance provided by the resistance 493 and diode-connected nFET 499, and the nFET 495, in combination with the diode-connected nFET 488, may provide a variable resistance of a path (e.g., circuit path) between the voltage signal node 466 and the output node 468, where that variability is independent of a voltage level of the voltage signal node 466. That is, at any given voltage level of the voltage signal node 466, the resistance of the path may be varied. The variable resistance provided by the resistance 493 and diode-connected nFET 499, and the nFET 495, in combination with the diode-connected nFET 488, may further provide a variable resistance of a path (e.g., circuit path) between the voltage signal node 466 and an input to the comparator 498, where that variability is independent of a gain of the voltage regulator 464C. That is, at any given gain of the voltage regulator 464C, the resistance of the path may be varied.

Figure 5:
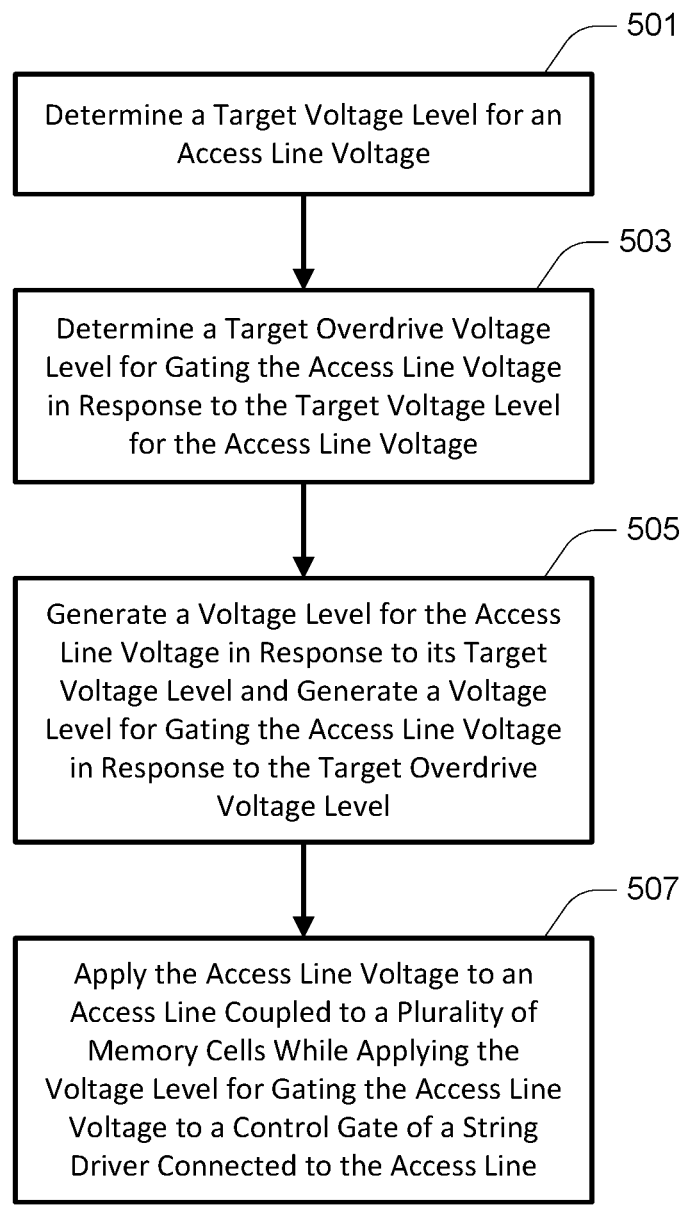
FIG. 5 is a flowchart of a method of operating a memory in accordance with an embodiment.

FIG. 5 is a flowchart of a method of operating a memory in accordance with an embodiment. At 501, a target voltage level for an access line voltage is determined. The target voltage level might be a voltage level of a programming pulse to be applied to an access line (e.g., selected access line) of an array of memory cells coupled to memory cells (e.g., one or more memory cells) selected for programming during a programming operation. The array of memory cell might have a NAND configuration, such as depicted in FIGS. 2A-2B, such that the memory cells selected for programming might be memory cells of different strings of series-connected memory cells.

Determining the target voltage level might include determining the target voltage level from a programming algorithm of a programming operation. For example, typical programming operations include an iterative process where a plurality of programming pulses are applied to the selected access line, and a verify operation is performed after each programming pulse to determine if any of the memory cells coupled to that access line have reached their desired data states. Each subsequent programming pulse may be higher than a prior programming pulse by a set differential. As such, a pulse count might be indicative of the target voltage level of that programming pulse.

Determining the target voltage level might alternatively include determining the target voltage level from a reference voltage signal, e.g., reference voltage signal Vref, that is indicative of the target voltage level. For example, in a voltage regulator of a type described with reference to FIGS. 4B-4C, the target voltage level might be a particular value of gain times the voltage level of the reference voltage signal Vref. Any other variables indicative of the target threshold voltage might also be used for determining the target voltage level.

At 503, a target overdrive voltage level for gating the access line voltage is determined in response to the target voltage level for the access line voltage, which might include being determined in response to a variable indicative of the target voltage level for the access line voltage. The target overdrive voltage level might be the target voltage level for the access line voltage plus a voltage differential. In general, higher voltage differentials between the voltage level for gating the access line voltage (e.g., the voltage signal Vpgmsw) and the voltage level to be applied to the access line (e.g., the voltage signal Vpgmreg) may produce decreasing string driver resistances, which may facilitate faster rise times of the resulting voltage level of the access line. However, generating higher voltage differentials generally increases power demands and reduces the life of the field-effect transistors used to gate the access line voltage. The desired voltage differential thus may be selected to obtain a resistance level of a string driver having a small or inconsequential impact on the rise time of the access line voltage.

Determining the target overdrive voltage level for gating the access line voltage might include determining settings for a voltage regulator regulating a voltage level of the overdrive voltage, e.g., a voltage signal applied to a control gate of a transistor selectively connecting the access line to that access line voltage. For example, this might include determining settings for the variable resistance 486 of the voltage regulator 464B or a value of the control signal at the control signal node 497 of the voltage regulator 464C.

At 505, a voltage level for the access line voltage is generated in response to its target voltage level, and a voltage level for gating the access line voltage is generated in response to the target overdrive voltage level. At 507, the access line voltage is applied to an access line coupled to a plurality of memory cells while the voltage level for gating the access line voltage is applied to a control gate of a string driver connected to the access line.

Figure 6A:
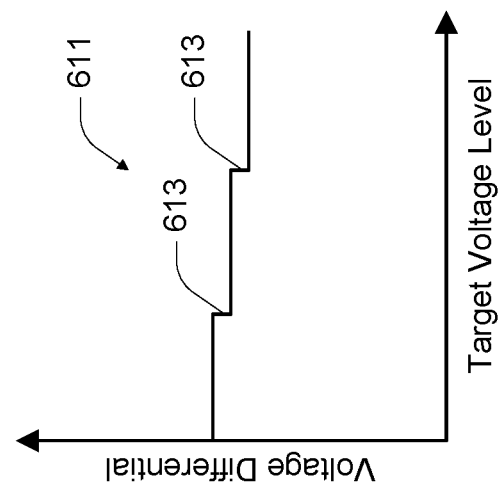
FIG. 6A-6C depict conceptual graphs of negative correlations of voltage differentials as a function of target voltage levels in accordance with embodiments.
Figure 6B:
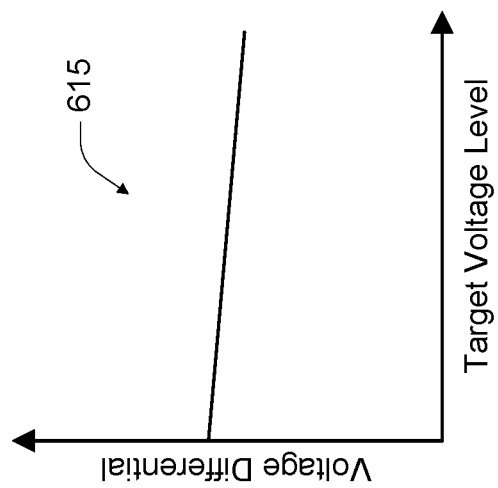
Figure 6C:
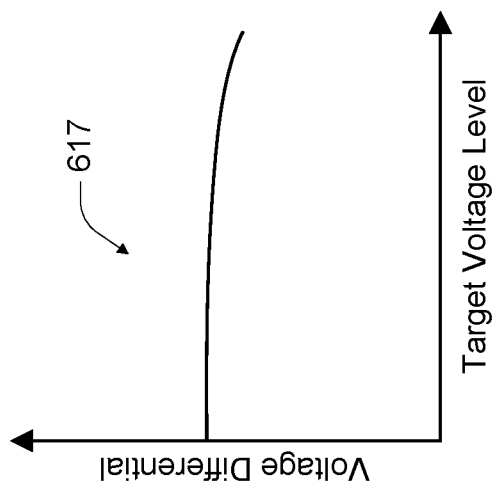

FIG. 6A-6C depict conceptual graphs of negative correlations of voltage differentials as a function of target voltage levels, e.g., of access line voltages, in accordance with embodiments. The graph of FIG. 6A depicts a step function, where the negative correlation of voltage differentials as a function of target voltage levels includes one or more steps 613 to a lower voltage level when the target voltage level of the access line voltage exceeds a particular value or values. The graph of FIG. 6B depicts a linear function, where the negative correlation of voltage differentials as a function of target voltage levels provides a lower voltage differential for each increasing value of the target voltage level. The graph of FIG. 6C depicts a curvilinear function, where the negative correlation of voltage differentials as a function of target voltage levels such that a value for the voltage differential for any particular value of target voltage level is less than or equal to the value for the voltage differential for each value of the target voltage level less than the particular value, and greater than or equal to the value for the voltage differential for each value of the target voltage level greater than the particular value. Other negative correlation of voltage differentials as a function of target voltage levels are suitable, e.g., such that a value for the voltage differential for any particular value of target voltage level is less than or equal to the value for the voltage differential for each value of the target voltage level less than the particular value, and greater than or equal to the value for the voltage differential for each value of the target voltage level greater than the particular value.

Figure 7:
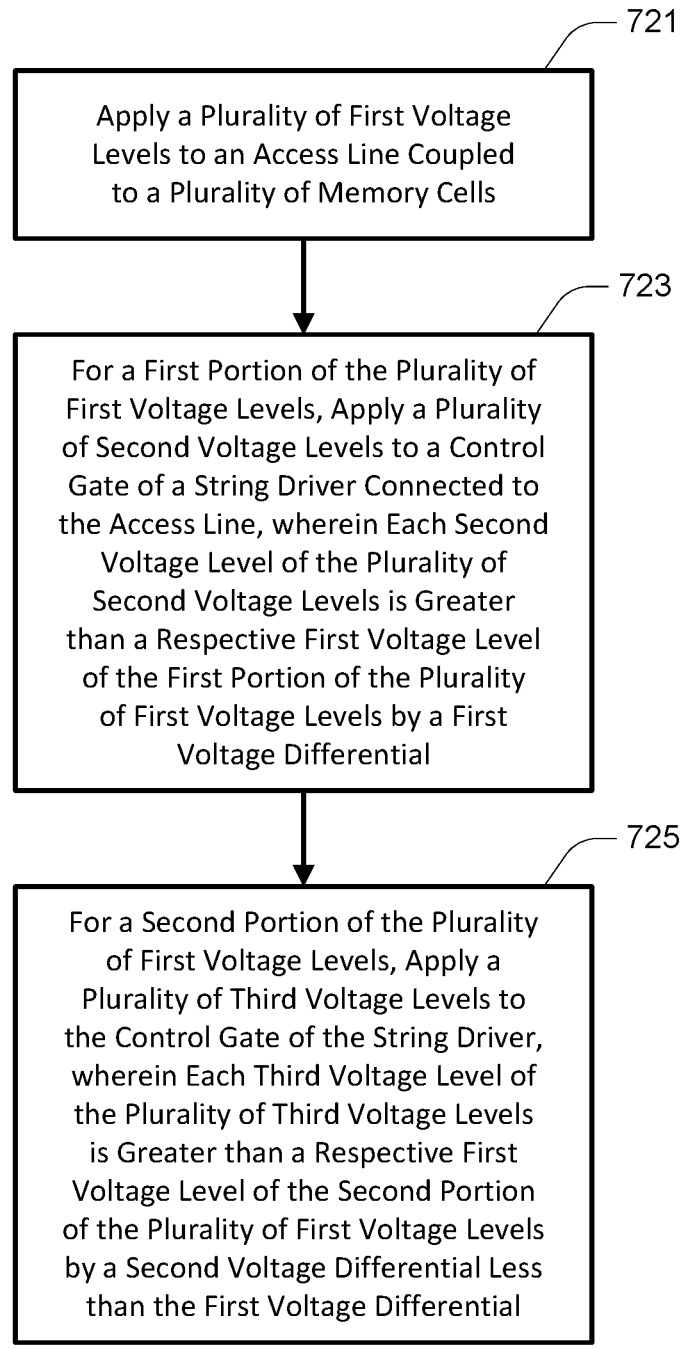
FIG. 7 is a flowchart of a method of operating a memory in accordance with an embodiment.

FIG. 7 is a flowchart of a method of operating a memory in accordance with an embodiment. At 721, a plurality of first voltage levels are applied to an access line coupled to a plurality of memory cells. For example, the plurality of first voltage levels might include a plurality of programming pulses having different voltage levels. The access line coupled to the plurality of memory cells might include an access line (e.g., selected access line) connected to control gates of the plurality of memory cells, where one or more of those memory cells are selected for a programming operation.

At 723, a plurality of second voltage levels are applied to a control gate of a string driver connected to the access line for a first portion of the plurality of first voltage levels. Each of the second voltage levels of the plurality of second voltage levels is greater than a respective first voltage level of the first portion of the plurality of first voltage levels by a first voltage differential. The first portion of the plurality of first voltage levels might be a first subset of the plurality of first voltage levels.

At 725, a plurality of third voltage levels are applied to the control gate of the string driver for a second portion of the plurality of first voltage levels. Each of the third voltage levels of the plurality of third voltage levels is greater than a respective first voltage level of the second portion of the plurality of first voltage levels by a second voltage differential less than the first voltage differential. The second portion of the plurality of first voltage levels might be a second subset of the plurality of first voltage levels, and the first subset and the second subset might be mutually exclusive.

Figure 8:
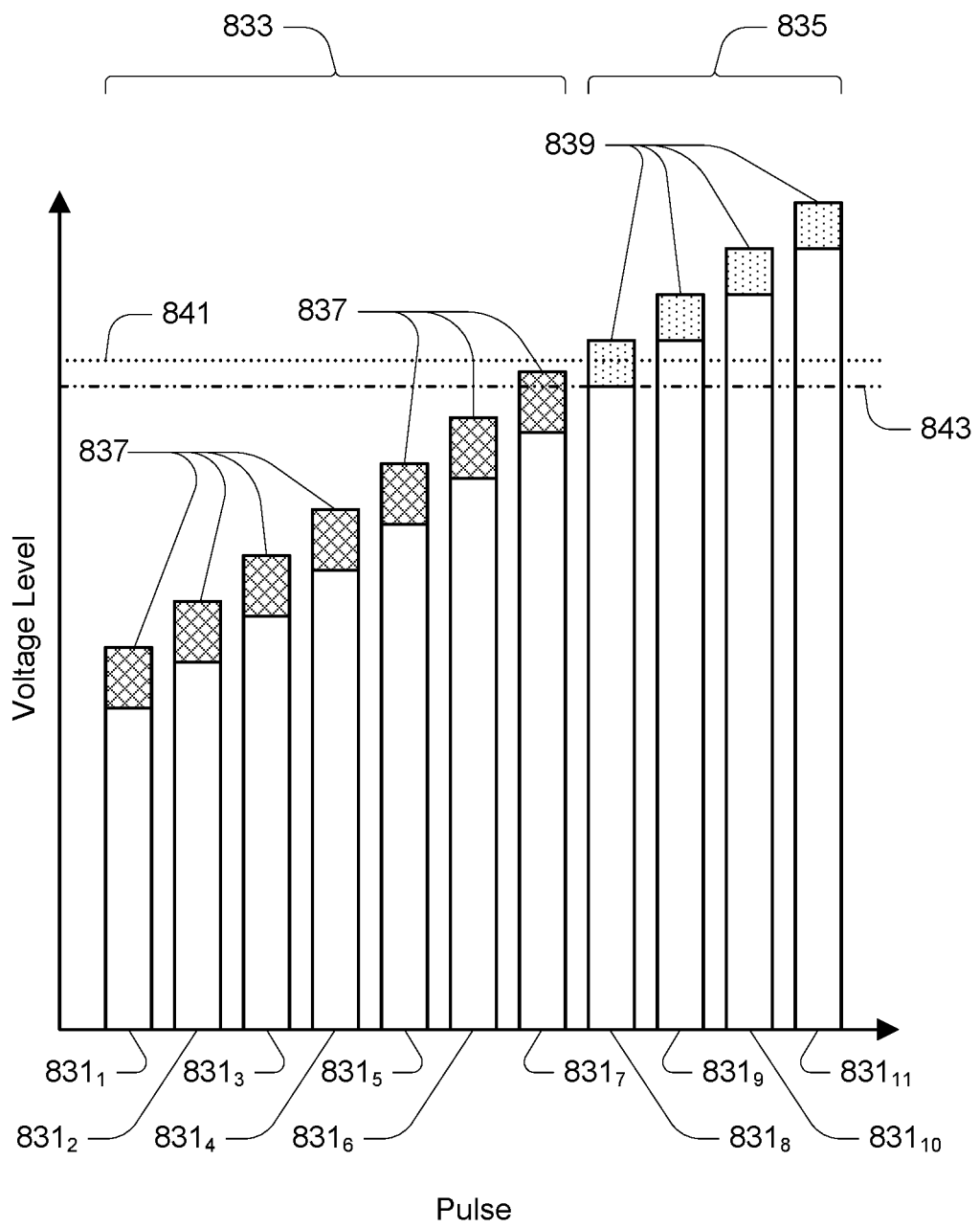
FIG. 8 depicts a conceptual histogram of programming pulses and corresponding gate voltage differentials in accordance with an embodiment.

FIG. 8 depicts a conceptual histogram of programming pulses and corresponding gate voltage differentials in accordance with an embodiment. FIG. 8 might depict a method of operating a memory such as described with reference to FIG. 7. FIG. 8 might also depict a negative correlation of voltage differentials as a function of target voltage levels as a step function (e.g., FIG. 6A) having one step 613.

FIG. 8 depicts a plurality of programming pulses 831. Although there are eleven programming pulses 831$_1$-831$_{11}$ depicted in FIG. 8 as a mere example, other numbers of programming pulses might be used. The programming pulses 831 are grouped into a first portion 833 including programming pulses 831$_1$-831$_7$ and a second (e.g., remaining) portion 835 including programming pulses 831$_8$-831$_{11}$. Each programming pulse 831 of the first portion of programming pulses 833 corresponds to a respective voltage differential 837, while each programming pulse 831 of the second portion of programming pulses 835 corresponds to a respective voltage differential 839. The corresponding overdrive voltage level, e.g., for applying to a control gate of a string driver connected to the selected access line, might be equal to the voltage level of its respective programming pulse 831 and its corresponding respective voltage differential 837 or 839. The voltage differentials 837 might each have a same value, the voltage differentials 839 might each have a same value, and the value of each voltage differential 839 might be less than the value of each voltage differential 837.

FIG. 8 further depicts a threshold (e.g., threshold voltage level) 841. The threshold 841 might represent a voltage limit (e.g., a desired maximum voltage level) for the voltage level for gating the programming pulse voltage level to the access line for the voltage differentials 837. The threshold might represent a maximum value for safe operation of a string driver, e.g., a limit imposed to mitigate damage to the string driver. For example, the threshold might represent a voltage level within the SOA of the string driver. However, the threshold may be determined in response to other or additional factors, e.g., desired power usage, programming speed, etc. The decision of when to switch to a different (e.g., lesser) voltage differential might be determined in response to this threshold 841, e.g., to maintain the voltage level of the programming pulse 831 plus its corresponding respective voltage differential 837 to be less than this threshold 841.

FIG. 8 still further depicts an alternative threshold (e.g., threshold voltage level) 843. The threshold 843 might represent a voltage level of a particular programming pulse, e.g., 24V. The decision of when to switch to a different (e.g., lesser) voltage differential might be determined in response to this threshold 843, e.g., a target voltage level of the programming pulse reaching this threshold 843.

Figure 9:
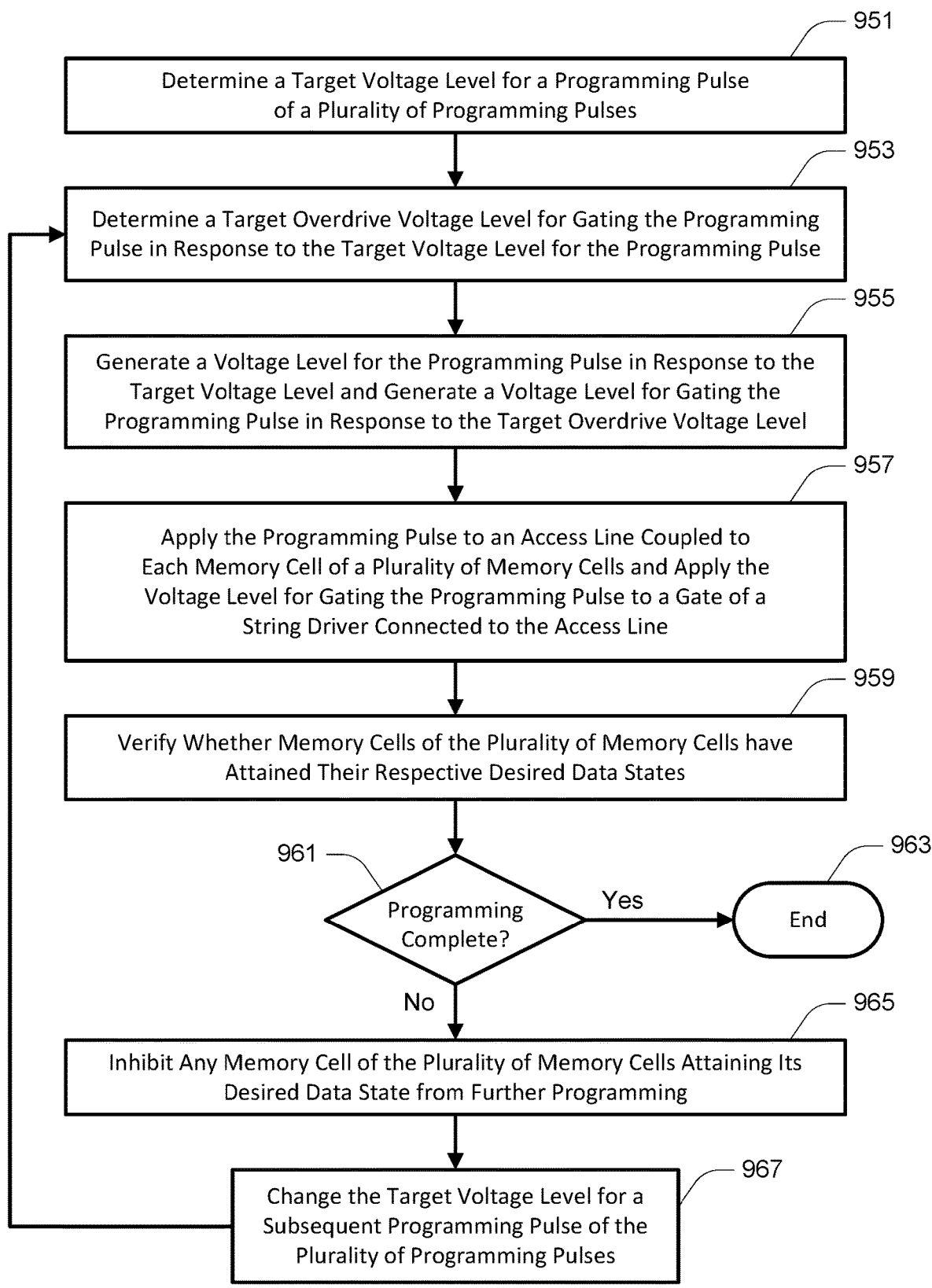
FIG. 9 is a flowchart of a method of operating a memory in accordance with an embodiment.

FIG. 9 is a flowchart of a method of operating a memory in accordance with an embodiment. At 951, a target voltage level for a programming pulse is determined. The target voltage level might be a voltage level of a programming pulse to be applied to an access line (e.g., selected access line) of an array of memory cells coupled to memory cells (e.g., one or more memory cells) selected for programming during a programming operation. The array of memory cell might have a NAND configuration, such as depicted in FIGS. 2A-2B, such that the memory cells selected for programming might be memory cells of different strings of series-connected memory cells.

Determining the target voltage level might include determining the target voltage level from a programming algorithm of a programming operation. For example, typical programming operations include an iterative process where a plurality of programming pulses are applied to the selected access line, and a verify operation is performed after each programming pulse to determine if any of the memory cells coupled to that access line have reached their desired data states. Each subsequent programming pulse may be higher than a prior programming pulse by a set differential. As such, a pulse count might be indicative of the target voltage level of that programming pulse.

Determining the target voltage level might alternatively include determining the target voltage level from a reference voltage signal, e.g., reference voltage signal Vref, that is indicative of the target voltage level. For example, in a voltage regulator of a type described with reference to FIGS. 4B-4C, the target voltage level might be a particular value of gain times the voltage level of the reference voltage signal Vref. Any other variables indicative of the target threshold voltage might also be used for determining the target voltage level.

At 953, a target overdrive voltage level for gating the programming pulse is determined in response to the target voltage level for the programming pulse. Determining the target overdrive voltage level for gating the programming pulse might include determining settings for a voltage regulator regulating a voltage level of the overdrive voltage, e.g., a voltage signal applied to a control gate of a transistor selectively connecting the selected access line to the programming pulse. For example, this might include determining settings for the variable resistance 486 of the voltage regulator 464B or a value of the control signal at the control signal node 497 of the voltage regulator 464C.

At 955, a voltage level for the programming pulse is generated in response to the target voltage level and a voltage level for gating the programming pulse to the selected access line is generated in response to the target overdrive voltage level. At 957, the programming pulse is applied to an access line coupled to each memory cell of a plurality of memory cells and the voltage level for gating the programming pulse is applied to a gate of a string driver connected to the access line, e.g., concurrently. As used herein, a first act and a second act occur concurrently when the first act occurs simultaneously with the second act for at least a portion of a duration of the second act. For example, for at least a portion of the time of applying the programming pulse, the voltage level for gating the programming pulse is being applied simultaneously to the gate of the string driver.

At 959, a verify operation may be performed to verify whether memory cells of the plurality of memory cells have attained their respective desired data states. If all memory cells of the plurality of memory cells selected for the programming operation have attained their desired data states at 961, the programming operation may end at 963. As is known in the art, the programming operation might also end at 963 if the programming operation is deemed to fail, e.g., if maximum number of programming pulses have been applied and one or more memory cells have not yet reached their desired data states.

If some (e.g., one or more) memory cells of the plurality of memory cells selected for the programming operation have yet to reach their respective desired data states at 961, memory cells of the plurality of memory cells attaining their desired data states may be inhibited from further programming at 965, e.g., for the remainder of the programming operation. As is known in the art, memory cells coupled to the selected access line that are not selected for the programming operation might also be inhibited from programming during the programming operation. At 967, the target voltage level for the programming pulse, e.g., a subsequent programming pulse of the plurality of programming pulses, is changed, e.g., increased, and the programming operation may then continue at 953.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the embodiments will be apparent to those of ordinary skill in the art. Accordingly, this application is intended to cover any adaptations or variations of the embodiments.

What is claimed is:

1. A method of operating a memory, comprising:
 applying a plurality of first voltage levels to an access line coupled to a plurality of memory cells of an array of memory cells of the memory;
 for a first portion of the plurality of first voltage levels, applying a plurality of second voltage levels to a control gate of a string driver connected to the access line, wherein each second voltage level of the plurality of second voltage levels is greater than a respective first voltage level of the first portion of the plurality of first voltage levels by a first voltage differential; and
 for a second portion of the plurality of first voltage levels, applying a plurality of third voltage levels to the control gate of the string driver, wherein each third voltage level of the plurality of third voltage levels is greater than a respective first voltage level of the second portion of the plurality of first voltage levels by a second voltage differential less than the first voltage differential;
 wherein each first voltage level of the first portion of the plurality of firsts voltage levels is applied to the access line prior to applying any first voltage level of the second portion of the plurality of first voltage levels.

2. The method of claim 1, wherein applying the plurality of second voltage levels to the control gate of the string driver for the first portion of the plurality of first voltage levels comprises the first portion of the plurality of first voltage levels containing those first voltage levels of the plurality of first voltage levels whose respective second voltage levels of the plurality of second voltage levels are less than or equal to a threshold.

3. The method of claim 2, wherein the threshold is determined responsive to a safe operating area of the string driver.

4. The method of claim 1, wherein applying the plurality of second voltage levels to the control gate of the string driver for the first portion of the plurality of first voltage levels, comprises the first portion of the plurality of first voltage levels containing those first voltage levels of the plurality of first voltage levels having voltage levels less than or equal to a threshold.

5. The method of claim 1, wherein the plurality of first voltage levels comprises a plurality of increasing first voltage levels.

6. The method of claim 1, wherein applying the plurality of first voltage levels comprises applying a plurality of different voltage levels.

7. The method of claim 1, further comprising:
 for a third portion of the plurality of first voltage levels, applying a plurality of fourth voltage levels to the control gate of the string driver, wherein each fourth voltage level of the plurality of fourth voltage levels is greater than a respective first voltage level of the third portion of the plurality of first voltage levels by a third voltage differential less than the second voltage differential.

8. The method of claim 7, wherein a difference between the second voltage differential and the first voltage differential is determined in response to a first step of a step function, and wherein a difference between the third voltage differential and the second voltage differential is determined in response to a second step of the step function.

9. A memory, comprising:
 an array of memory cells;
 a plurality of access lines, wherein each access line of the plurality of access lines is coupled to a respective plurality of memory cells of the array of memory cells; and
 a controller, wherein the controller is configured to cause the memory to:
  apply a plurality of first voltage levels to a particular access line of the plurality of access lines;
  for a first portion of the plurality of first voltage levels, apply a plurality of second voltage levels to a control gate of a string driver connected to the particular access line, wherein each second voltage level of the plurality of second voltage levels is greater than a respective first voltage level of the first portion of the plurality of first voltage levels by a first voltage differential; and for a second portion of the plurality of first voltage levels, apply a plurality of third voltage levels to the control gate of the string driver, wherein each third voltage level of the plurality of third voltage levels is greater than a respective first voltage level of the second portion of the plurality of first voltage levels by a second voltage differential less than the first voltage differential;

wherein each first voltage level of the first portion of the plurality of first voltage levels is applied to the access line prior to applying any first voltage level of the second portion of plurality of first voltage levels.

10. The memory of claim 9, wherein the first portion of the plurality of first voltage levels comprises the first voltage levels of the plurality of first voltage levels whose respective second voltage levels of the plurality of second voltage levels are less than or equal to a threshold.

11. The memory of claim 10, wherein the threshold is determined responsive to a safe operating area of the string driver.

12. The memory of claim 9, wherein the first portion of the plurality of first voltage levels comprises the first voltage levels of the plurality of first voltage levels having voltage levels less than or equal to a threshold.

13. The memory of claim 9, wherein the plurality of first voltage levels comprises a plurality of increasing first voltage levels.

14. The memory of claim 9, wherein the plurality of first voltage levels comprises a plurality of different voltage levels.

15. The memory of claim 9, wherein the controller is further configured to cause the memory to:

for a third portion of the plurality of first voltage levels, apply a plurality of fourth voltage levels to the control gate of the string driver, wherein each fourth voltage level of the plurality of fourth voltage levels is greater than a respective first voltage level of the third portion of the plurality of first voltage levels by a third voltage differential less than the second voltage differential.

16. The memory of claim 15, wherein a difference between the second voltage differential and the first voltage differential is determined in response to a first step of a step function, and wherein a difference between the third voltage differential and the second voltage differential is determined in response to a second step of the step function.

17. A memory, comprising:

an array of memory cells;

a plurality of access lines, wherein each access line of the plurality of access lines is coupled to a respective plurality of memory cells of the array of memory cells; and a controller, wherein the controller is configured to cause the memory to:

apply a plurality of first voltage levels to a particular access line of the plurality of access lines, wherein each first voltage level of the plurality of first voltage levels is higher than each preceding first voltage level of the plurality of first voltage levels and lower than each subsequent first voltage level of the plurality of first voltage levels;

for each first voltage level of a first portion of the plurality of first voltage levels, apply a respective second voltage level of a plurality of second voltage levels to a control gate of a string driver connected to the particular access line, wherein each second voltage level of the plurality of second voltage levels is greater than its respective first voltage level of the first portion of the plurality of first voltage levels by a first voltage differential; and for each first voltage level of a second portion of the plurality of first voltage levels mutually exclusive to the first portion of the plurality of first voltage levels, apply a respective third voltage level of a plurality of third voltage levels to the control gate of the string driver, wherein each third voltage level of the plurality of third voltage levels is greater than its respective first voltage level of the second portion of the plurality of first voltage levels by a second voltage differential less than the first voltage differential;

wherein each first voltage level of the second portion of the plurality of first voltage levels is higher than each first voltage level of the first portion of the plurality of first voltage levels; and wherein each first voltage level of the first portion of the plurality of first voltage levels is applied to the access line prior to applying any first voltage level of the second portion of the plurality of first voltage levels.

18. The memory of claim 17, wherein the respective plurality of memory cells for the particular access line comprises a subset of memory cells of the respective plurality of memory cells for the particular access line that are selected for programming while applying the plurality of first voltage levels to the particular access line.

19. The memory of claim 17, wherein an initial first voltage level of the second portion of the plurality of first voltage levels occurs immediately subsequent to a final first voltage level of the first portion of the plurality of first voltage levels in the plurality of first voltage levels.

20. A memory, comprising:

an array of memory cells;

a plurality of access lines, wherein each access line of the plurality of access lines is coupled to a respective plurality of memory cells of the array of memory cells and a controller;

wherein the controller is configured to cause the memory to;

apply a plurality of first voltage levels to a particular access line of the plurality of access lines, wherein each first voltages level of the plurality of first voltage levels is higher than each preceding first voltage level of the plurality of first voltage levels and lower than each subsequent first voltage level of the plurality of first voltage levels;

for each voltage level of a first portion of the plurality of first voltage levels, apply a respective second voltage level of a plurality of second voltage levels to a control gate of a string driver connected to the particular access line, wherein each second voltage level of the plurality of second voltage levels is greater than its respective first voltage level of the first portion of the plurality of first voltage levels by a first voltage differential; and for each first voltage level of a second portion of the plurality of first voltage levels mutually exclusive to the first portion of the plurality of first voltage levels, apply a respective third voltage level of a plurality of third voltage levels to the control gate of the string driver, wherein each third voltage level of the plurality of third voltage levels is greater than its respective first voltage level of the second portion of the plurality of first voltage levels a second voltage differential less than the first voltage differential;

wherein each first voltage level of the second portion of the plurality of first voltage levels is higher than each first voltage level of the first portion of the plurality of first voltage levels; and wherein the controller is further configured to cause the memory to generate the plurality of first voltage levels, the plurality of second voltage levels and the plurality of third voltage levels using a voltage generation system, the voltage generation system comprising:

a first voltage generation device for generating a first voltage signal at an output node of the first voltage generation device;

a second voltage generation device for generating a second voltage signal at an output node of the second voltage generation device; and a voltage regulator comprising an output node, a first voltage signal node configured to receive the first voltage signal, a second voltage signal node configured to receive the second voltage signal, and a third voltage signal node configured to receive a reference voltage signal, the voltage regulator further comprising:

a comparator comprising an output node, a first input node connected to the third voltage signal node, and a second input node connected to the output node of the voltage regulator;

a first variable resistance path between the first voltage signal node and the output node of the voltage regulator, wherein a variability of the first variable resistance path is independent of a voltage level of the first voltage signal node; and a second variable resistance path between the first voltage signal node and the second input node of the comparator, wherein a variability of the second variable resistance path is independent of a gain of the voltage regulator;

wherein the first voltage generation device is configured to increase a voltage level of the first voltage signal in response to a first logic level at the output node of the comparator, and to allow the voltage level of the first voltage signal to decrease in response to a second logic level, different than the first logic level, at the output node of the comparator;

wherein the second voltage generation device is configured to increase a voltage level of the second voltage signal in response to the first logic level at the output node of the comparator, and to allow the voltage level of the second voltage signal to decrease in response to the second logic level at the output node of the comparator;

wherein, for each second voltage level of the plurality of second voltage levels, the output node of the first voltage generation device is connected to the control gate of the string driver while applying that second voltage level, and the output node of the voltage regulator is connected to the particular access line while applying that second voltage level; and wherein, for each third voltage level of the plurality of third voltage levels, the output node of the first voltage generation device is connected to the control gate of the string driver while applying that third voltage level, and the output node of the voltage regulator is connected to the particular access line while applying that third voltage level.

\* \* \* \* \*

UNITED STATES PATENT AND TRADEMARK OFFICE
CERTIFICATE OF CORRECTION

PATENT NO. : 11,538,529 B2
APPLICATION NO. : 17/176345
DATED : December 27, 2022
INVENTOR(S) : Xiaojiang Guo et al.

It is certified that error appears in the above-identified patent and that said Letters Patent is hereby corrected as shown below:

In the Claims

Column 18, Claim 20, Line 53, delete "for each voltage level of a first" and insert in place thereof --for each first voltage level of a first--

Signed and Sealed this
Seventh Day of May, 2024

Katherine Kelly Vidal
Director of the United States Patent and Trademark Office